United States Patent [19]

Ceraso

[11] Patent Number: 4,702,789
[45] Date of Patent: Oct. 27, 1987

[54] METHOD FOR APPLYING A PORTION OF A PHOTOSENSITIVE FILM TO AT LEAST ONE FACE OF A FLAT PLATE HAVING A SURFACE AREA GREATER THAN SAID PORTION

[75] Inventor: Arcangelo B. Ceraso, Milan, Italy

[73] Assignee: Morton Thiokol, Inc., Chicago, Ill.

[21] Appl. No.: 912,440

[22] Filed: Sep. 26, 1986

Related U.S. Application Data

[62] Division of Ser. No. 450,476, Dec. 16, 1982, Pat. No. 4,650,536.

[30] Foreign Application Priority Data

Feb. 10, 1982 [IT] Italy ............................. 46808 A/82

[51] Int. Cl.$^4$ ............................................. B32B 31/18
[52] U.S. Cl. .................................. 156/256; 156/263; 156/299; 156/272.2
[58] Field of Search ........ 156/230, 250, 256, 263–264, 156/297, 299, 300–301, 303, 350, 362–364, 354–355, 511, 516–518, 521–522, 502, 504, 497, 555, 199, 267, 265, 272.2, 273.3, 273.5; 100/93 RP, 176; 226/196–197; 29/730

[56] References Cited

U.S. PATENT DOCUMENTS

| | | | |
|---|---|---|---|
| 1,292,119 | 1/1919 | Staley | 156/522 |
| 1,921,939 | 8/1933 | Parker | 156/522 |
| 2,004,657 | 6/1935 | Gerard | 425/115 |
| 2,538,520 | 1/1951 | Holt | 156/522 |
| 2,776,068 | 1/1957 | Johnson | 156/353 |
| 2,818,908 | 1/1958 | Byrnes | 156/522 |
| 3,574,040 | 4/1971 | Chitwood | 156/522 |
| 3,623,933 | 11/1971 | Staats | 156/555 |
| 3,647,602 | 3/1972 | McGuire | 156/525 |
| 3,658,629 | 4/1972 | Cramer | 156/522 |
| 3,674,590 | 7/1972 | Halman | 156/522 |
| 3,713,948 | 1/1973 | Kluger | 156/521 |
| 3,745,081 | 7/1973 | Erekson | 156/521 |
| 3,783,074 | 1/1974 | Land | 156/299 |
| 3,816,215 | 6/1974 | Wethington | 156/522 |
| 3,954,550 | 5/1976 | Patterson | 156/522 |
| 3,955,481 | 5/1976 | Heitmann | 156/521 |
| 3,984,244 | 10/1976 | Collier | 156/230 |
| 4,004,962 | 1/1977 | Kleid | 156/522 |
| 4,021,288 | 5/1977 | Hannon | 100/93 RP |
| 4,025,373 | 5/1977 | Hirsch | 156/517 |
| 4,025,380 | 5/1977 | Bernardo | 156/355 |
| 4,026,000 | 5/1977 | Anderson | 29/730 |
| 4,026,754 | 5/1977 | Bogdanski | 156/521 |
| 4,080,727 | 3/1978 | Stoelle | 156/263 |
| 4,080,732 | 3/1978 | Eberle | 29/730 |
| 4,119,481 | 10/1978 | Beckley | 156/273.3 |
| 4,214,936 | 7/1980 | DelBianco | 156/361 |
| 4,268,345 | 5/1981 | Semchuck | 156/555 |
| 4,377,434 | 3/1983 | DelBianco | 156/522 |
| 4,397,704 | 8/1983 | Frick | 156/517 |
| 4,491,492 | 1/1985 | Hetherington | 156/521 |
| 4,505,772 | 3/1985 | Renz | 156/364 |
| 4,585,509 | 4/1986 | Obasashi | 156/517 |
| 4,619,728 | 10/1986 | Brink | 156/555 |

FOREIGN PATENT DOCUMENTS

| | | |
|---|---|---|
| 1577639 | 7/1969 | Fed. Rep. of Germany . |
| 2013063 | 3/1971 | Fed. Rep. of Germany . |
| 2853033 | 6/1980 | Fed. Rep. of Germany . |
| 2162894 | 7/1973 | France . |

Primary Examiner—Donald E. Czaja
Assistant Examiner—Merrell C. Cashion, Jr.
Attorney, Agent, or Firm—James C. Simmons; Gerald K. White

[57] ABSTRACT

A machine for applying a portion of photosensitive film to at least one face of a flat plate having a surface area greater than said portion, starting from at least one reel (66) of said material, comprises, downstream of said reel (66), first means (73) for laterally trimming the photosensitive strip of material (66) to a width less than the width of the plate (4), intermediate means (21), (74) on which said film (66) thus trimmed rests and is retained, associated with means (37), (78) arranged to separate portions of strip (66) having a length less than the length of the plate (4), and means (26), (27) controlled by suitable control means (28), (29) and by suitable positioning means (33), (34), (36) such that the plate (4) receives the film (66) in the correct position, and further comprises subsequent laminating means (48) for fixing the film (66) to the plate (4).

20 Claims, 9 Drawing Figures

METHOD FOR APPLYING A PORTION OF A PHOTOSENSITIVE FILM TO AT LEAST ONE FACE OF A FLAT PLATE HAVING A SURFACE AREA GREATER THAN SAID PORTION

This is a division of application Ser. No. 450,476, filed on Dec. 16, 1982, now U.S. Pat. No. 4,650,536.

The present invention pertains to the photoengraving field generally, and more particularly relates to a machine for applying portions of photosensitive film, commonly known as a dry film, by positioning them onto plate members having a surface area greater than the surface area of said portions, in such a manner as to leave the edges of said members uncovered.

Machines are presently known for applying portions of a film to plates of the same or smaller size than said portions, with the result that the film occupies the entire surface, at least in one direction, and sometimes projects beyond the plate.

This is done at the present time by using machines, commonly known as laminating machines, consisting essentially of two superimposed unwinding units, and two superimposed pressure rollers lying between said two units and provided for applying two stratified films onto the opposing faces of the plates, which are fed between said pressure rollers.

Each stratified film is composed, in known manner, of a central gelatin layer disposed between two protective sheets or layers.

The unwinding units comprise a shaft disposed transversely to the plate transfer direction, and on which a reel of stratified film is rotatably mounted, there being also provided an idle rewinding roller which makes contact with said reel, by which it is driven, and which removes a protective layer from the stratified film.

Each stratified film is driven by the pressure rollers, which are conveniently motorised.

The wide use of known laminating machines of the aforesaid type has brought to light the drawbacks listed hereinafter.

A first drawback is that such known laminating machines deliver at their outlet or discharge end a succession or alignment of laminated plates which are connected together by at least one stratified film, which as stated is unwound continuously from the respective reel by said pressure rollers.

Furthermore, after the lamination operation, the plates are completely covered on at least one face thereof, at least in the feeding direction, by said stratified film which, in certain cases, projects not only beyond the front and rear ends of the plate, but also beyond at least one of its side edges.

Because of this, it is necessary to first separate said succession of plates from each other, and each plate is then trimmed in order to remove the projecting portions of the stratified film.

This trimming operation is usually carried out manually, requiring considerable use of labour for carrying out the repetitive operations, and adding to the cost of the finished product.

Furthermore, the manual trimming leads to the formation of small scrap portions and particles which remain associated with the trimmed plates, even during the subsequent operating stages, and in many cases give rise to production rejects.

In addition, the fact that the film covers the entire plate and projects beyond its edges lead to a continuous waste of dry film, with an economic production penalty which is not indifferent when one considers the high cost of such a stratified film.

A further drawback of the aforesaid laminating machines is the fact that on termination of the lamination operation, the pair of dry films also cover any centering holes which may be provided in the plates, in particular in the case of cards for manufacturing printed circuits, in which hinders the easy and correct insertion of the normal setting pins during the subsequent operations to which the laminated plates are subjected.

Finally, the presence of the continuous strip of plates at the discharge station of said known laminating machines makes the plate discharge operation extremely difficult and complicated, and in particular makes it difficult to carry out the discharge operation automatically, unless extremely complicated and/or sophisticated and thus extremely costly equipment are utilized.

The present patent application provides a laminating machine which obviates the aforementioned drawbacks by utilizing a rational and highly reliable constructional design.

The fundamental concept on which the present invention is based is to separate film portions from two normal reels of dry film and then apply these portions within the perimeter of the plates, so as to leave free the edges of the plates in which the centering holes are disposed.

According to a first embodiment of the present invention, this is attained by providing, upstream of two application rollers, two superimposed horizontal perforated drums subjected to suction and situated above and below the path to be followed by the plates and directed towards the laminating rollers and normally outside of said path. On their lower front generating lines there is retained a dry film which originates from a unwinding unit.

Other fundamental elements of the aforesaid constructional design are a longitudinal cutter provided at each unwinding unit, and a transverse cutter provided at the front of each perforated drum, these cutters being arranged to separate, from the two stratified films, portions having a perimeter which lies within the profile (perimeter) of the respective plates to be covered.

Furthermore, the two drums are vertically mobile with mutual approach and withdrawal motions, which take place at a predetermined rate in order to apply pressure to the front edges of the sectors at a position inward from the corresponding edge of the plate being processed, the remaining portions of said sectors being applied with pressure from the laminating rollers.

The drums are also driven with a stepwise rotary motion so as to correctly position the drums and dry film sectors relative to the transverse cutters and relative to the plates being processed. Downstream of the upper perforated drum and before the corresponding laminating roller there is provided a suction shoe for supporting the sectors leaving the upper drum, in order to prvent them from becoming disposed incorrectly before their treatment by the laminating roller.

The machine movements are controlled by an electronic processor, from which the machine receives suitable signals, and which is set for choosing the overall length of the dry film portions, this being the difference between the total plate length and the width of the front and rear plate edges which are to be left uncovered.

According to the present invention, the same advantageous results are attained by providing, instead of said two perforated drums, a pair of fixed perforated half drums, of which the flat longitudinal wall is disposed to the rear of the path followed by the plates or cards in order to act as a packing blade for the corresponding transverse cutter.

Furthermore, parallel to said flat longitudinal wall there is disposed a vertical mobile pad, the purpose of which is to cause the front edge of the corresponding dry film sector to adhere to the card.

Normal pressure means for fixing the film to the plate are provided downstream.

The constructional characteristics and merits of the invention will be more apparent from the description given hereinafter with reference to the figures of the accompanying drawings, which illustrate two preferred embodiments by way of non-limiting examples.

Figure 3:
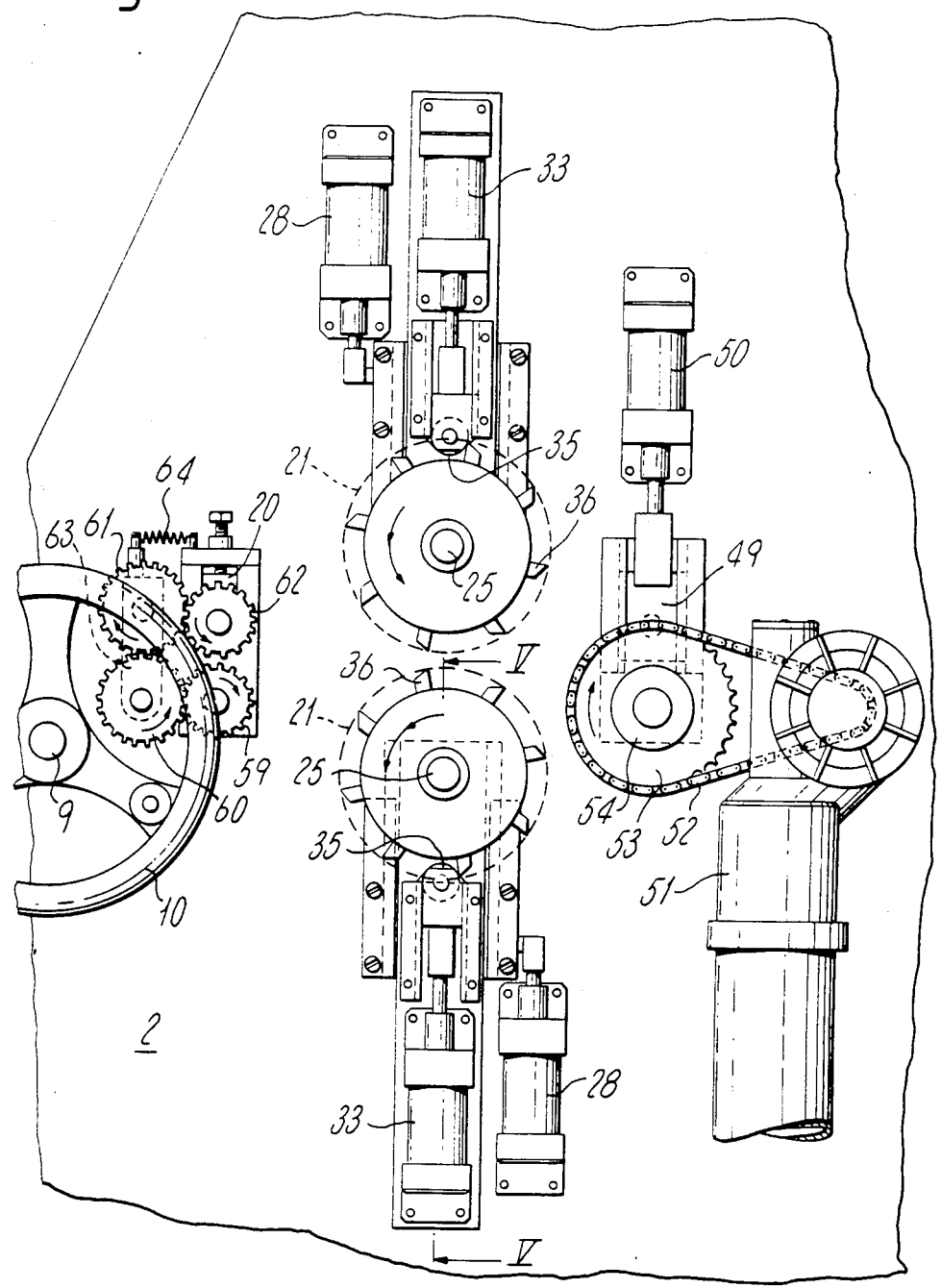
FIGS. 3 and 4 are enlarged views of the two sides of the machine comprising the machine drive side and the driven side, respectively.
Figure 4:
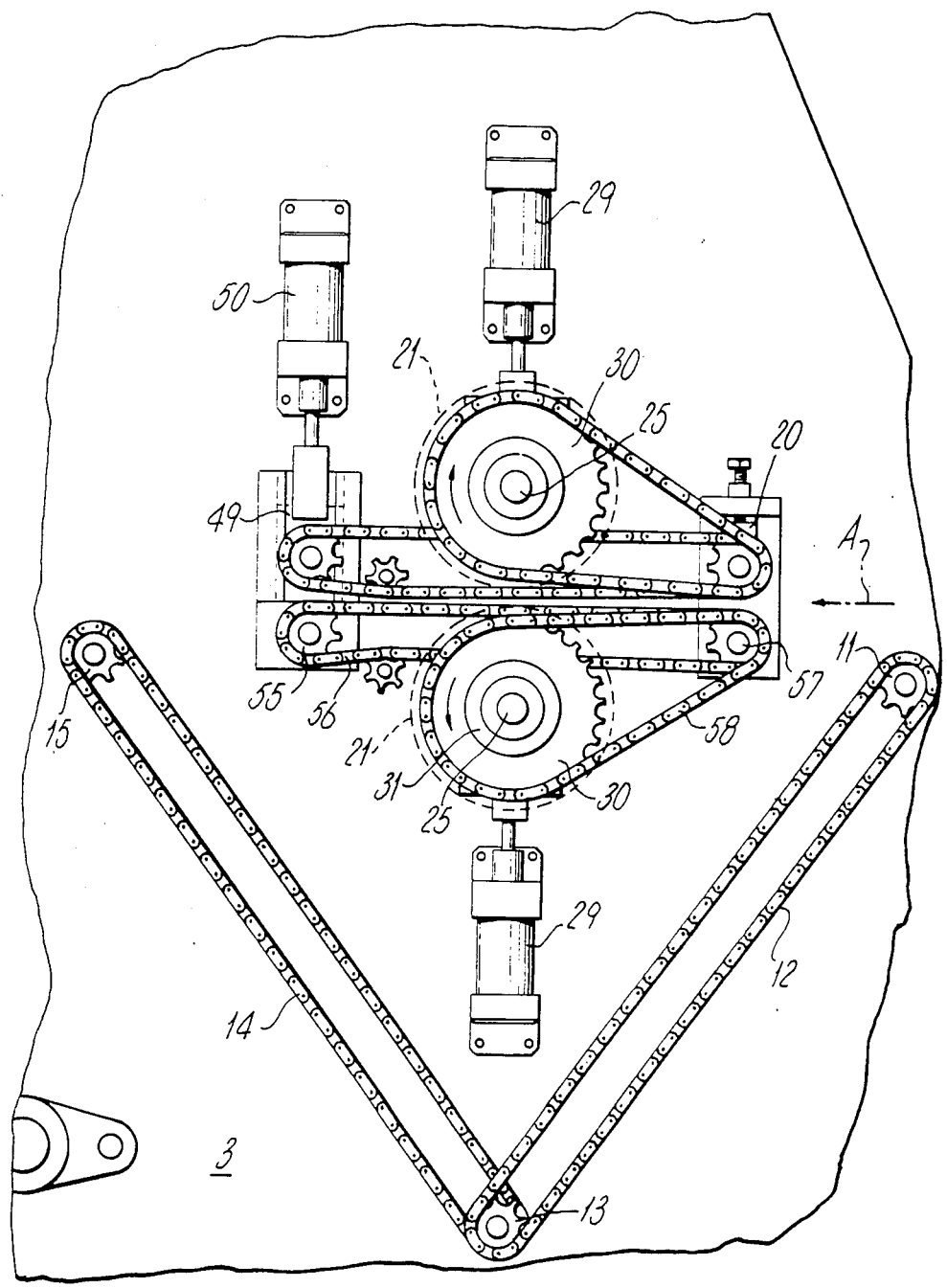
Figure 5:
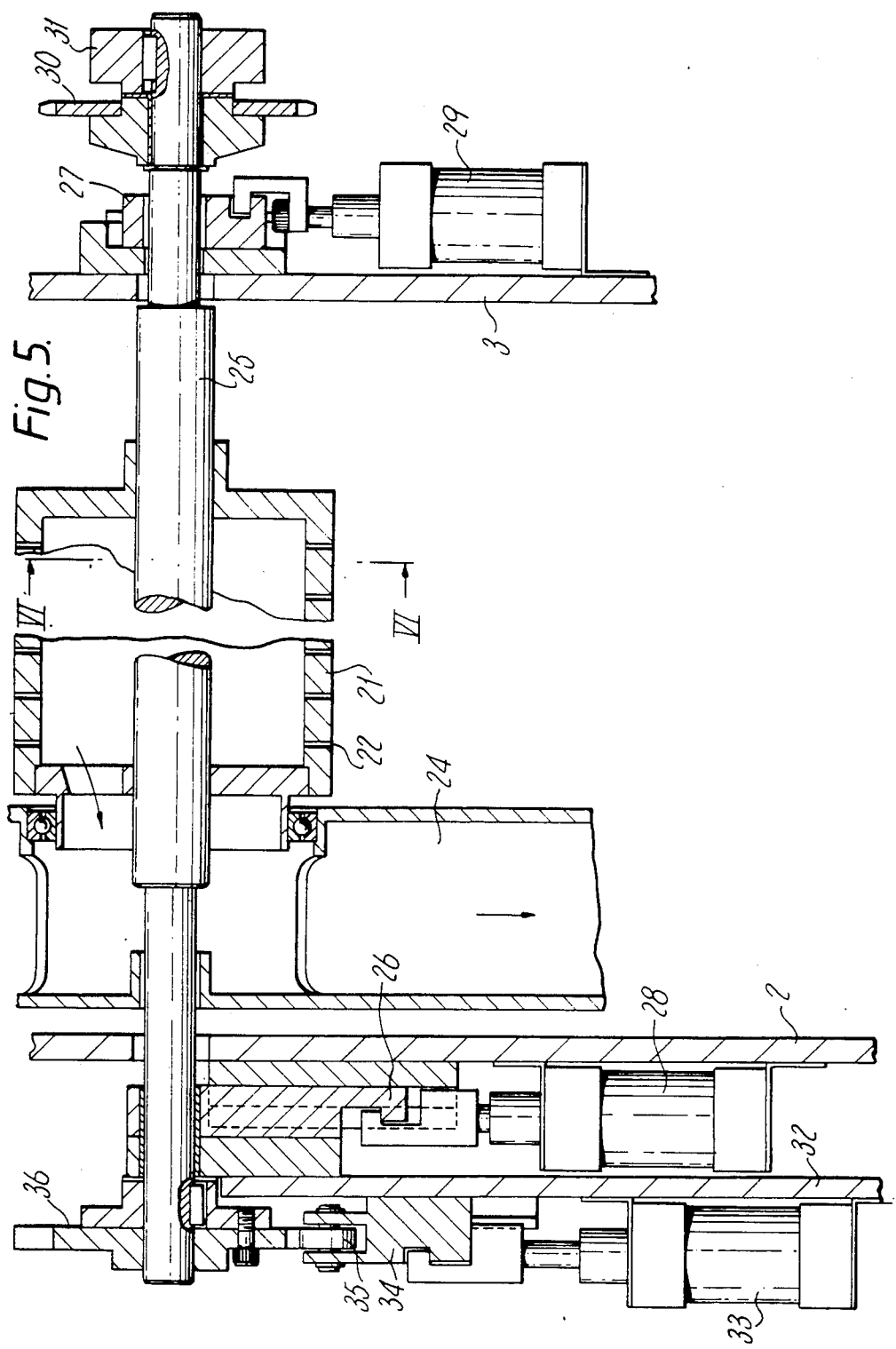
FIG. 5 is a section taken along line V—V of FIG. 3, in an enlarged scale.

The figures show a base casing 1 (FIG. 1), from the sides of which project two shoulders 2 and 3, shown in the accompanying FIGS. 3 to 5.

Figure 1:
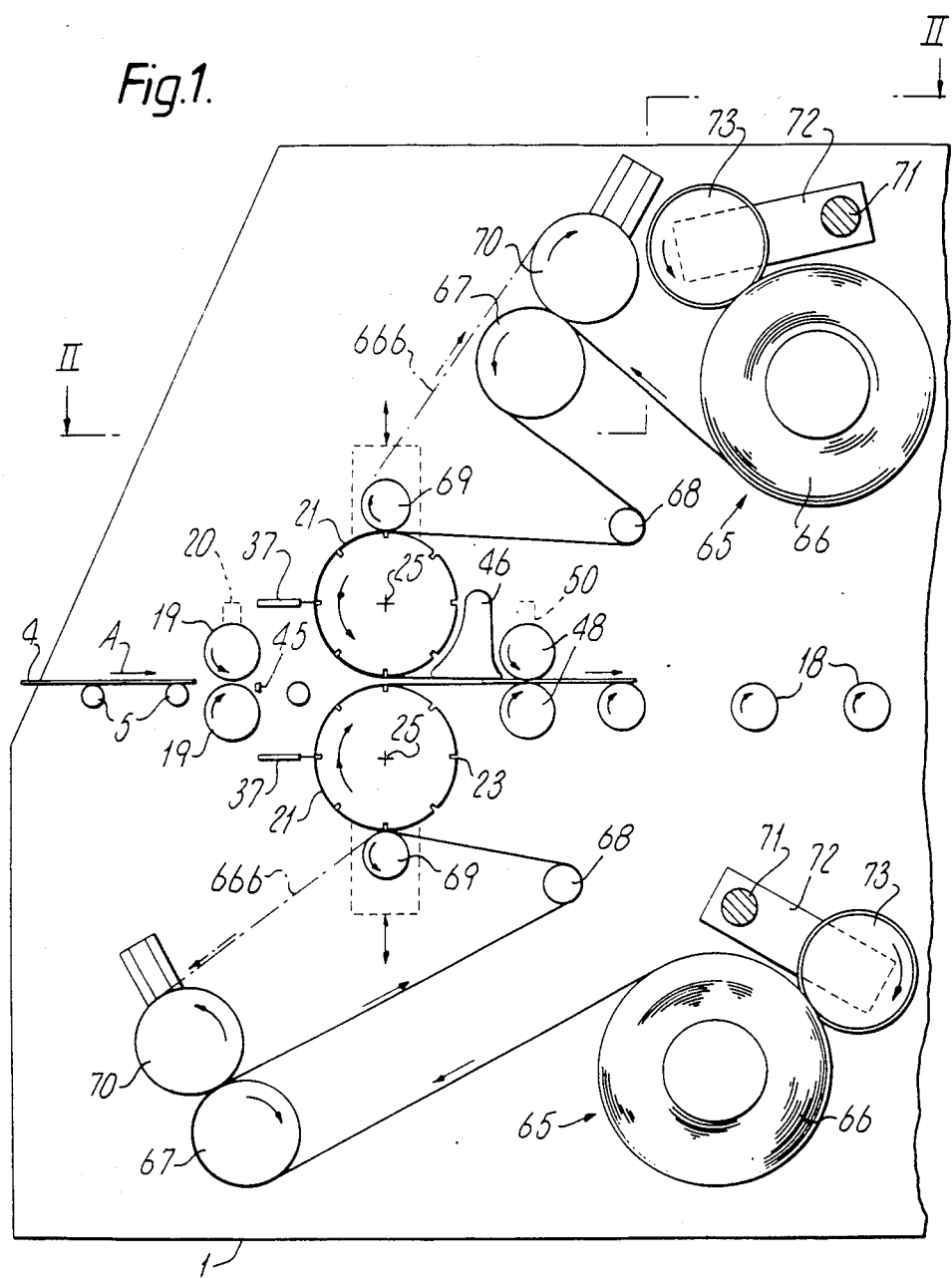
FIG. 1 is an overall diagrammatic vertical longitudinal section through a first embodiment of the present invention.

The cards 4 to be laminated are inserted between the two shoulders in the transfer direction A indicated in FIG. 1.

The cards can be rigid or flexible, metal or non-metal.

Figure 6:
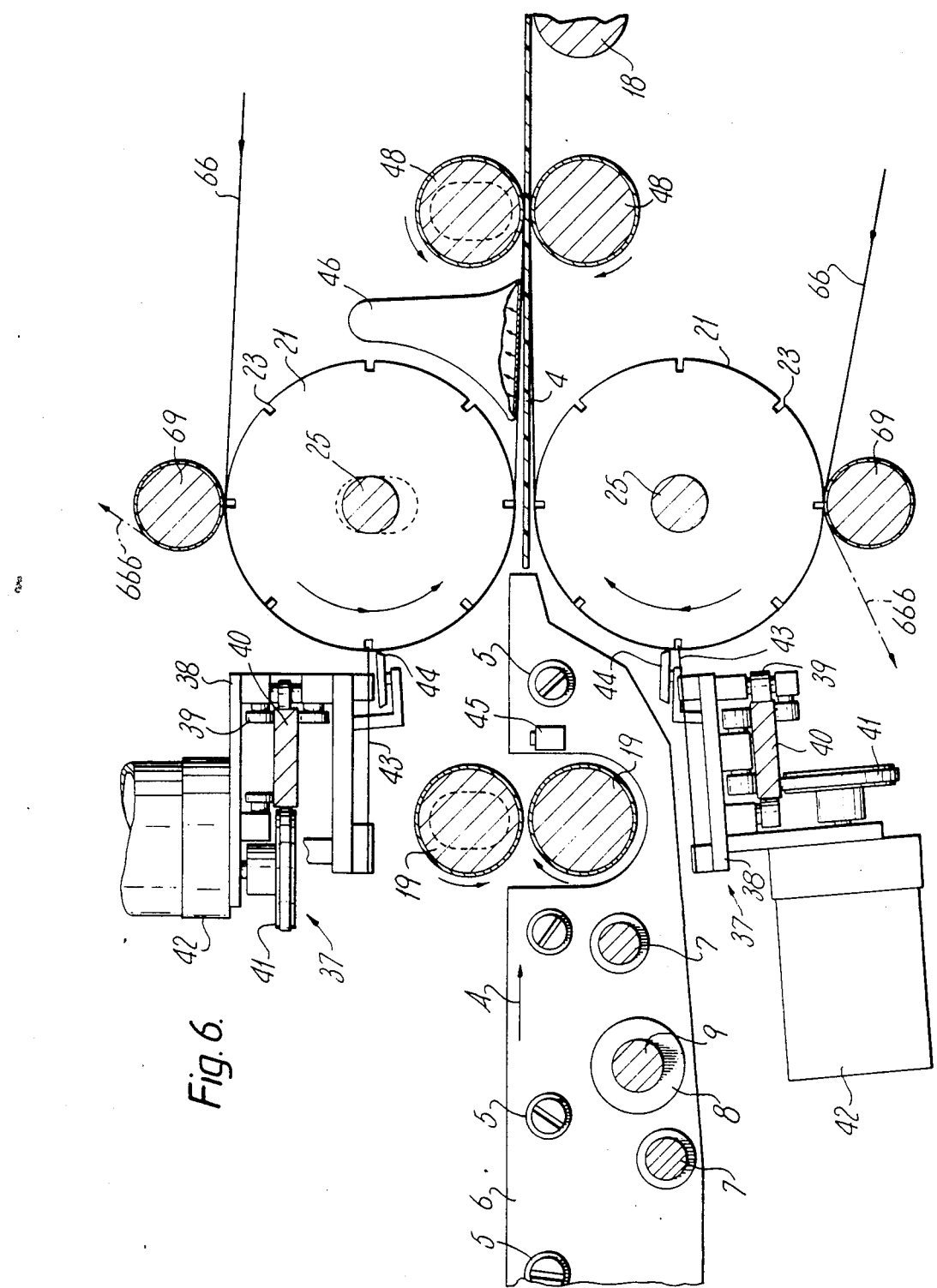
FIG. 6 is a section taken along line VI—VI of FIG. 5.

The machine feed inlet comprises two horizontal opposing rows of idle rollers 5, shown in FIGS. 1 and 6, which are cantilever mounted on the inner faces of two profiled vertical guide plates 6. The two profiled plates 6 are slidably mounted on two horizontal transverse bars 7, and their distance apart are adjusted by respective threaded collars 8 which engage with two threads provided on the two ends of a threaded shaft 9. The two threads are opposite handed so that the shaft 9 can be rotated in order to adapt the distance between the plates 6 to the width of the cards 4, by a handwheel 10 (FIG. 3) located on the outside of the shoulder 2.

Figure 2:
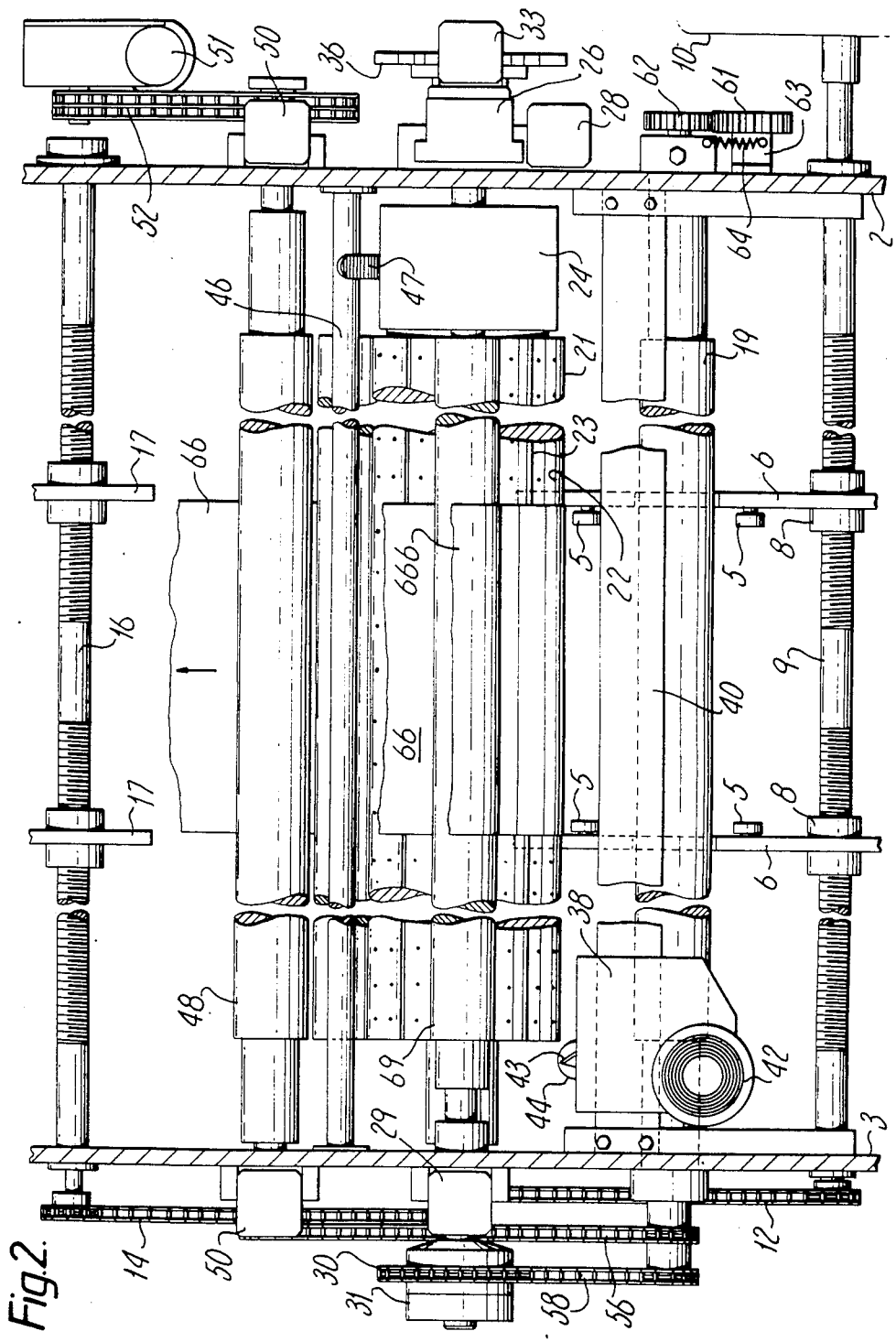
FIG. 2 is a section taken along line II—II of FIG. 1.

At the other shoulder 3, see FIGS. 2 and 4, on the free end of the threaded shaft there is fixed a sprocket wheel 11 about which there winds a chain 12, which passes about an underlying double sprocket wheel 13 rotatably mounted on the shoulder 3.

A second chain 14 winds about the double sprocket wheel 13, and passes about an overlying rear sprocket wheel 15.

The rear sprocket wheel is fixed on a threaded shaft 16, completely similar to the shaft 9, and on which there are provided two guides 17 arranged to guide the cards during their discharge, i.e. after they have been laminated.

The guides 17, completely similar to the guides 6, are associated with a motorised discharge roller table 18 shown in FIG. 1.

The same figure shows that immediately downstream of the front guides 6 there is disposed a pair of overlying motorised insertion rollers 19, the cylindrical surfaces of which are covered with a layer of suitable soft elastically deformable material, such as rubber.

The lower insertion rollers 19 occupies a fixed height position, whereas the upper roller is rotatably mounted on two vertical end slides 20 which are constantly urged resiliently downward.

The purpose of the rollers 19, which are best shown in FIGS. 1 and 6, is to insert the cards 4 between a pair of superposed horizontal drums 21.

The cylindrical wall of each drum 21 is provided with a plurality of small suction through holes 22, and longitudinally comprise eight small through slots 23, which are disposed circumferentially and equidistant from each other.

The number of slots is not limitative and can vary.

FIG. 5 shows that at one end the two drums 21 communicate with a vertical suction chamber 24, which is supported by the drums themselves, by way of suitable bearings.

The vertical chamber 24 is connected by a flexible hose to an electric motor-driven suction fan housed in the base casing 1, and not shown because it is of a standard type.

The two ends of the support shaft 25 of each drum 21 pass through suitable vertical slots to the outside of the shoulders 2 and 3, where they are rotatably mounted on two vertical slides 26 and 27, respectively.

These are controlled by corresponding double acting pneumatic cylinder-piston units 28 and 29.

A sprocket wheel 30, against which a friction clutch device 31 rigid with the shaft 25 acts, is rotatably mounted on that end of each shaft 25 corresponding to the cylinder-piston unit 29, as shown in FIGS. 4 and 5.

A vertical plate 32 is fixed to the vertical slide 26, and acts as a support base for a double acting pneumatic cylinder-piston unit 33, provided for operating a second vertical slide 34.

Each of these comprises, on the end facing the respective shaft 25, an idle wheel 35 arranged for insertion, in the manner of a locking bolt, into the tooth spaces of a ring gear 36 which is fixed on to said shaft 25, as shown in FIGS. 2, 3 and 5 taken together.

Downstream of the perforated drums 21, FIGS. 2 and 6 show two transverse cutters 37 disposed above and below the insertion rollers 19 respectively.

Each transverse cutter 37 comprises a carriage 38 which is slidably mounted, by way of a suitable group of idle rollers 39, on a transverse plate 40 which connects the two shoulders 2 and 3 together.

The to-and-fro strokes of each carriage along the respective plate or rolling track 40 are controlled by a friction wheel 41 which acts on the track 40, and which is driven by a suitable electric motor 42.

The electric motor, which can rotate in both directions, is supported by its own carriage, which on the side facing the other cutter also carries a blade 43, the cutting profile of which forms an acute angle with the axis of the corresponding drum 21.

As clearly shown on the accompanying FIG. 2, each blade 43, when at rest, lies external to its drum, whereas during the cutting stages its pointed end slides into one of the longitudinal slots 23 in said drum.

In proximity to said pointed end there is an idle roller 44 with its axis orthogonal to the axis of the corresponding blade, and is mounted on an arm which is resiliently urged towards the drum 21.

Although not shown, suitable feelers, for example in the form of microswitches, are provided at the limit stops of said cutters 37 in order to reverse and halt the movement of said cutters.

Further feelers, also not shown, are provided at the vertical slides 26, 27 and 34 in order to halt the machine when one of said slides operates abnormally.

Finally, as shown in FIGS. 1 and 6, immediately downstream of the insertion rollers 19 there is a sensor 45 which sets the machine for a new complete operating cycle each time a card arrives.

Immediately downstream of the upper perforated drum 21 (FIG. 6), there is a transverse suction box 46, of which the lower flat wall comprises a plurality of small through holes.

The box 46 is connected to the vertical suction chamber 24 by a flexible hose 47 shown in FIG. 2.

Downstream of the box 46 there are two motorised laminating rollers 48 of known type, which are completely similar to the insertion rollers 19.

As shown in FIGS. 3 and 4, the two ends of the upper laminating roller 48 are rotatably mounted on two vertical slides 49 which are elastically urged downwards by respective single acting pneumatic cylinder-piston units 50.

The elastic load acting on the slides 20 and 49 is adjustable.

The machine movements are derived from a single drive unit 51 located in the rear zone of the shoulder 2 (FIG. 3).

The drive unit 51 is an electric geared motor with an incorporated variator with instantaneous stoppage.

The drive shaft of said unit 51 drives a chain 52 which passes about a sprocket wheel 53 fixed on to the shaft of the lower laminating roller 48.

On the outside of the sprocket wheel 53 there is a step counter 54, and on the opposite end of the lower laminating roller 48 there is fixed a sprocket wheel 55 about which passes a chain 56 (FIG. 4).

This latter passes over a double sprocket wheel 57 rigid with the lower insertion roller 19, and around its second toothing there is wound a chain 58, which passes over the lower sprocket wheel 30, which is provided with a friction clutch 31.

As can be seen from the accompanying FIG. 4, the upper rotatable members of the machine are provided with connections which are completely similar to the preceding, the motion reversal for said upper members being carried out on the opposite shoulder of the machine, as shown in FIG. 3.

In this respect, it can be seen that on the other end of the lower insertion roller 19 there is fixed a gear wheel 59 which is in constant engagement with an idle gear wheel 60, which in turn engages with a further idle gear wheel 61.

In its turn, the idle gear wheel 61 engages with a gear wheel 62 which is fixed on to the shaft of the upper insertion roller 19, the idle gear wheel 61 being mounted on a lever 63 which is hinged to the shaft of the idle gear wheel 60.

Engagement between the two gear wheels 61 and 62 is ensured by a suitable tension spring 64.

The accompanying figures clearly show the directions of rotation of the aforesaid members.

At this point it should be noted that, very advantageously, the invention utilises the movements made available at said group of gear wheels in order to operate a loading device such as a roller table, not shown, which will obviously be disposed immediately upstream of the guides 6.

The operation can be effected, for example, by means of a linkage in the form of chains and respective sprocket wheels.

Although not shown, it should be noted that a linkage of this type is provided on the inside of one of the shoulders 2 and 3, to control the discharge roller table 18 which derives its motion from the lower laminating roller 48.

Above and below the path followed by the cards 4, and within the two machine shoulders 2 and 3, there are disposed two unwinding units 65 described hereinafter with reference to FIG. 1.

Each of these units comprises a reel of dry film 66, which comprises a photosensitive layer covered by two protection layers.

The dry film passes over first and second idler rollers, 66 and 67, then over the front generating lines of the respective drum 21, against which it adheres by virtue of the vacuum present therein.

An idle roller 69 is in contact with the drum 21 along the generating lines at the inlet of the respective dry film, and is constantly and elastically urged towards the drum.

The roller 69 also constitutes the deviation roller for one of the layers 666 protecting the dry film, namely the protection layer which covers the etching face of the photosensitive film.

The layer 666 winds around an idle stripping roller 70 which rests on the corresponding deviation roller 67, by which it is driven.

At its ends, the stripping roller is housed in two suitable guides which allow it to move as its diameter varies.

Immediately above each reel of dry film 66 there is disposed a transverse cylindrical bar 71, provided with a longitudinal cutter for the dry film.

The cutter comprises an arm 72 which, at its free end, carries a blade in the form of an idle disc 73, whereas at its other end it is provided with a resilient clamp for its setting along the bar 71 and its locking thereon.

The longitudinal cutters, which are normally excluded during the lamination of large series of cards for which a reel of dry film of convenient width is made available, are particularly advantageous then small series of cards, platen, sheets or information plates, which can be different from each other, are to be laminated.

The machine heretofore described is provided with a normal unit for heating the cards, not shown, to enable the dry films to adhere perfectly to the cards in known manner.

According to the present invention, the heating unit can be provided upstream of the insertion rollers 19, at the insertion rollers, or alternatively at the laminating rollers 48 or downstream thereof.

The machine operation is controlled by an electronic processor, not shown, on the control panel of which can be set the overall length of the card being processed, and the width of the front and rear edges of the card which are to be left uncovered or free from dry film.

Figure 7:
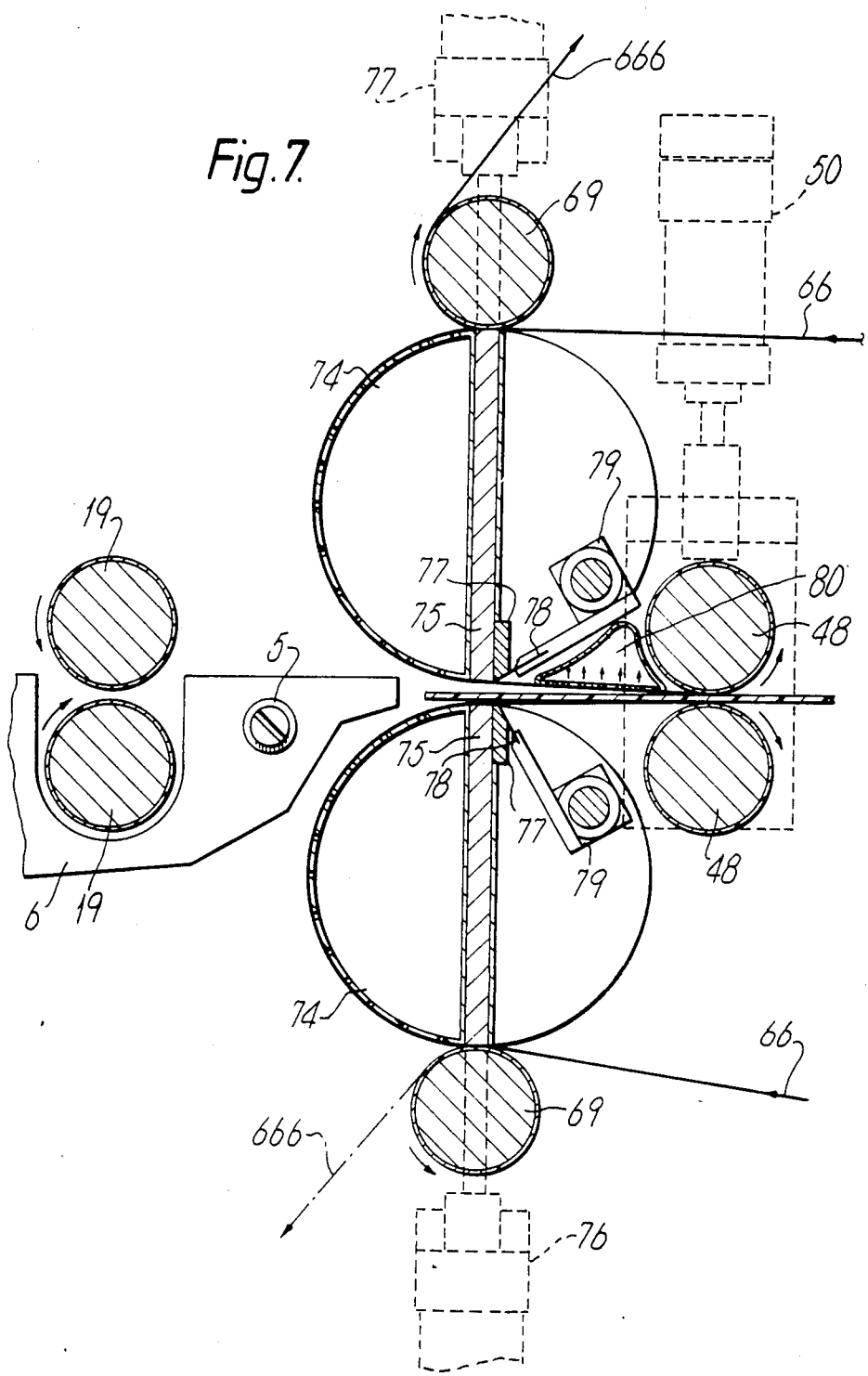
FIG. 7 is a vertical longitudinal section, similar to that of FIG. 6, showing a second embodiment of the present invention.

The alternative embodiment of the present invention shown in FIG. 7 differs from the preceding embodiment by the different structure of the perforated chambers around which the dry films 66 are passed.

Said figure shows that between the insertion rollers 19 and laminating rollers 48 there are disposed two overlying perforated semi-cylindrical chambers 74 subjected to suction as in the case of the aforesaid drums 21, and having their longitudinal flat walls lying vertically and facing the machine discharge zone.

The lower of the two semi-cylindrical chambers occupies a fixed position, whereas the upper chamber can be adjusted in height according to the thickness of the film 4.

To the rear of said longitudinal flat wall, and parallel thereto, there is provided a vertically slidable pad 75 controlled by respective double acting pneumatic cylinder-piston end units 76.

Each pad 75 is designed to slide between said longitudinal flat wall of the semi-cylindrical chamber 74 and a backing blade 77 for a knife 78.

The knife is supported by a transverse carriage 79 shown diagrammatically, and completely similar to the aforesaid carriage 38.

Between the upper semi-cylindrical chamber 74 and the corresponding laminating roller 48 there is a suction box 80, of which the lower perforated flat wall is coplanar with a plane tangential to the lower generating lines of the upper semi-cylindrical chamber 74 and of the upper laminating roller 48.

The first embodiment of the machine according to the present invention operates as follows.

Before a card 4 is inserted between the insertion rollers 19, the two drums 21 are in a stationary spaced-apart position, and the front edges of the two dry films 66 are in positions corresponding with the two slots 23 disposed in front of the blades 43.

The drums 21 are kept stationary by the wheels 35, against which the teeth of the ring gears 36 rest, the sprocket wheels 30 rotating idly on the shafts 25 of the perforated drums.

When the card passes beyond the insertion rollers, it is sensed by the member 45, which sets the machine for a complete operating cycle.

At this point, the cylinder-piston units 33 release the ring gears 36 such that the two drums 21, now driven by the sprocket wheels 30, rotate to follow the card being processed.

When the front edge of the card passes beyond the front edges of the dry films 66 by a distance previously memorized in the machine electronic processor, the two drums 21 close on to the card under the control of the cylinder-piston units 28 and 29, to then roll on the card through a distance, for example of 1 cm, which is sufficient to ensure adherence of the dry films to the card.

After this stage, the wheels 35 are again inserted into the tooth spaces of the ring gears 36, which continue to rotate until two successive slots 23 are positioned in front of the blades 43, and in the meantime the two drums withdraw from each other, and the card 4, which was initially urged by the insertion rollers 19 and then dragged by the laminating rollers 48, drags the two dry films 66 which then slide on the drums 21 which at this time have become stationary.

At a certain point, the step counter 54 causes the motor 51 to halt, and the carriages 38 are activated so that they carry out a complete outward and return stroke.

In this manner, from each film 66, a dry film sector is separated having a length conforming to the data previously fed into the electronic processor controlling the machine.

After the cutting operation, the motor 51 restarts, and the two sectors of dry film are dragged by the moving card while the drums remain stationary, i.e. ready for a new operating cycle which is repeated in the manner heretofore described for the subsequent cards 4.

When the end part of the upper sector of dry film leaves the corresponding drum 21, said part is supported by the suction box 46 in such a manner as to prevent the dry film from becoming disposed incorrectly on the card with the formation of creases and curling in the laminate which would give rise to rejects.

Furthermore, as shown in FIGS. 1 and 6, during the application stages the two dry film sectors converge slightly towards the laminating zone, so as to prevent any air bubbles from becoming trapped between the card and the two sectors.

The aforesaid is also valid for the embodiment of FIG. 7, which operates in the following manner.

When the front edge of a card 4 has passed beyond the backing blades 77 by a distance equal to the distance set on the machine electronic control processor, the motor 51 is halted and the two pads 75 are activated in order to apply the front edges of the dry films 66 to the card.

Immediately afterwards, the two pads are withdrawn and the motor restarts, so that the card drags the two dry film. The motor stops again when two sectors of dry film 66 of predetermined length pass beyond the backing blades 77.

At this point, the knives 78 cut said two sectors of dry film, the motor 51 restarts and the operating cycle is repeated identically for the cards to follow.

As will be apparent, a machine of this type produces cards intended for the manufacture of photoengraved products in general, the cards comprising on their opposing faces two sectors of dry film which leave uncovered a perimeter rim of the respective faces to which the films are applied.

Figure 8:
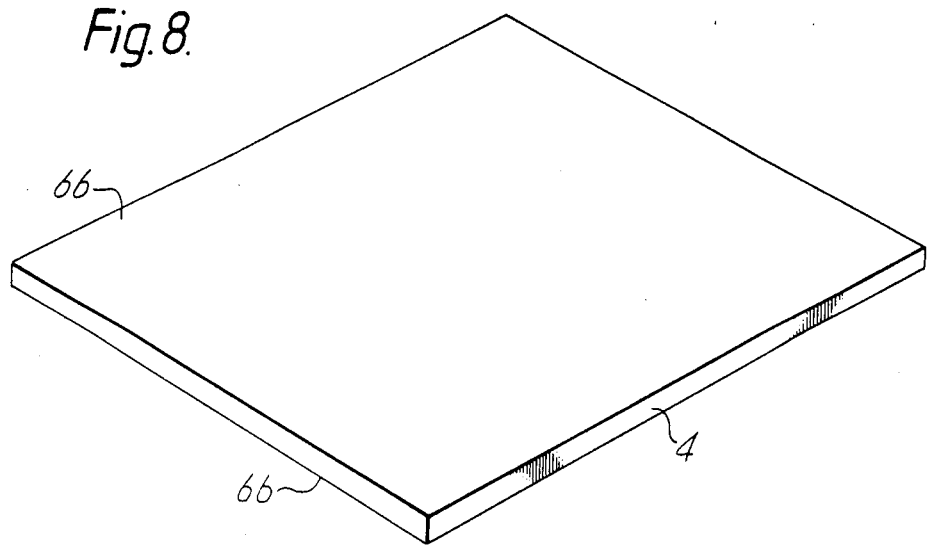
FIGS. 8 and 9 are two perspective views showing the same type of card laminated by the method of the prior art and laminated by the method of the present invention.
Figure 9:
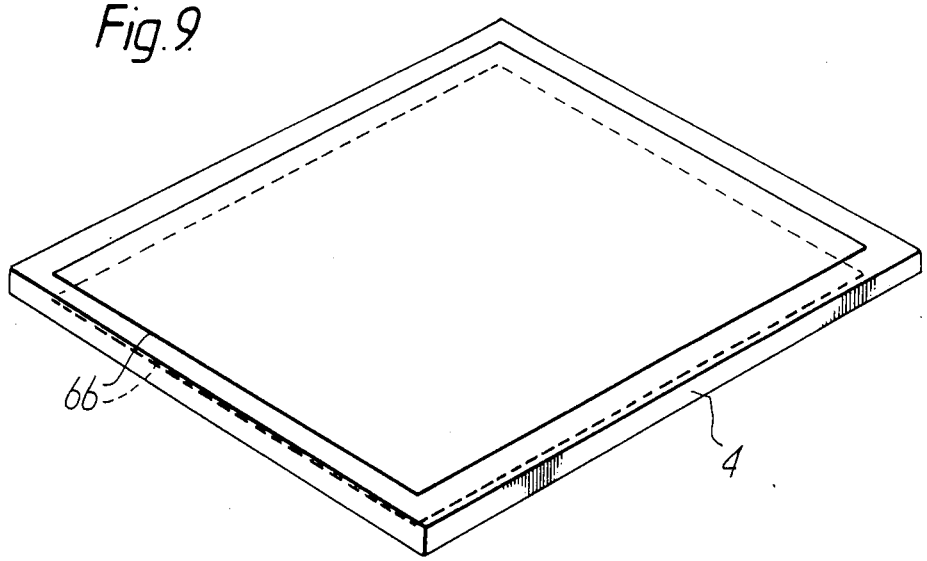

Such a card is shown in FIG. 9, while FIG. 8 shows a conventional card obtained by the prior art.

The advantages of the machine heretofore described are apparent when compared with the prior art described in the initial part of the present application.

The invention is not limited only to the embodiments heretofore described, and modifications and improvements can be made thereto without departing from the spirit and scope of the present invention which are summarized in the following claims.

What is claimed is:

1. A method of applying a photosensitive film portion to at least one face of each of a succession of support members each of which has front, side, and rear edges such that the support member face extends beyond the film portion at each of the edges whereby the film portion perimeter lies within the profile of the support member face, the method comprises the steps of:
   a. supplying film having a leading edge to at least one of a pair of opposing cylindrical surfaces,
   b. cutting the film to a predetermined film width less than the respective support member width while it is being supplied to the at least one cylindrical surface,
   c. inserting a support member between the pair of cylindrical surfaces,
   d. rotating the at least one cylindrical surface a predetermined amount to position the film leading edge between the at least one cylindrical surface and the support member, e. positioning the support member such that its front edge extends beyond the film leading edge by a predetermined distance and with each of the support member sides extending beyond the respective film sides by a predetermined distance, f. attaching the film leading edge to the support member, g. cutting from the film a film portion having a predetermined length less than the support member length by a predetermined amount greater than the predetermined distance the support member front edge extends beyond the film leading edge while the film portion is disposed on the at least one cylindrical surface, h. fixing the film portion to the support member, and i. repeating steps b through h for each of the succeeding support members.

2. A method according to claim 1 further comprises the steps of locking the at least one cylindrical surface from rotating, after the film portion is cut, whereby the film leading edge is positioned at the location of the cut for rotation of the at least one cylindrical surface the predetermined amount so that another film portion having the predetermined length may be cut for a successive application to another support member while the at least one cylindrical surface is locked from rotating, fixing the film portion to the support member during which the film portion is dragged from the at least one cylindrical surface, and repeating the above steps for each of the succeeding support members.

3. A method according to claim 1 further comprises the step of supporting the film portions as they leave the at least one cylindrical surface to prevent the formation of creases and curling as the film portions are disposed on the respective support members by operating a suction box downstream of the at least one cylindrical surface.

4. A method according to claim 1, wherein the step of attaching the film leading edge to the support member includes closing the cylindrical surfaces onto the support member by moving at least one of the cylindrical surfaces toward the other; and rolling each respective support member with the film leading edge disposed thereon through a distance sufficient for adhering the film leading edge to the respective support member.

5. A method according to claim 1 further comprises providing perforations in a drum upon which the at least one cylindrical surface is provided and applying a vacuum internally of the drum to hold the film on the at least one cylindrical surface.

6. A method according to claim 1 wherein the step of cutting the film includes providing along the periphery of a drum upon which is provided the at least one cylindrical surface a plurality of slots which extend substantially parallel to the rotational axis of the drum, and sliding a blade into and out of the slots for cutting the film.

7. A method according to claim 1 further comprises sensing a predetermined position of a support member and setting the apparatus for another operating cycle when the predetermined position is sensed.

8. A method according to claim 1 further comprises heating the support member.

9. A method of applying a photosensitive film portion to at least one face of each of a succession of support members each of which has front, side, and rear edges such that the support member face extends beyond the film portion at least at the front edge, the method comprises the steps of:

a. supplying film having a leading edge to at least one of a pair of opposing cylindrical surfaces, b. inserting a support member between the pair of cylindrical surfaces, c. rotating the at least one cylindrical surface a predetermined amount to position the film leading edge between the at least one cylindrical surface and the support member, d. positioning the support member such that its front edge extends beyond the film leading edge by a predetermined distance, e. attaching the film leading edge to the support member, f. cutting from the film a film portion having a predetermined length less than the support member length while the film portion is disposed on the at least one cylindrical surface, g. locking the at least one cylindrical surface from rotating, after the film portion is cut, whereby the film leading edge is positioned at the location of the cut for rotation of the at least one cylindrical surface the predetermined amount so that another film portion having the predetermined length may be cut for a successive application to another support member, h. while the at least one cylindrical surface is locked from rotating, fixing the film portion to the support member during which the film portion is dragged from the at least one cylindrical surface, and i. repeating steps b through h for each of the succeeding support members.

10. A method according to claim 9 further comprises the step of supporting the film portions as they leave the at least one cylindrical surface to prevent the formation of creases and curling as the film portions are disposed on the respective support members by operating a suction box downstream of the at least one cylindrical surface.

11. A method according to claim 9 wherein the step of attaching the film leading edge to the support member includes closing the cylindrical surfaces onto the support members by moving at least one of the cylindrical surfaces toward the other, and rolling each respective support member with the film leading edge disposed thereon through a distance sufficient for adhering the film leading edge to the respective support member.

12. A method according to claim 9 further comprises providing perforations in a drum upon which the at least one cylindrical surface is provided, and applying a vacuum internally of the drum to hold the film on the at least one cylindrical surface.

13. A method according to claim 9 wherein the step of cutting the film includes providing along the periphery of a drum upon which is provided the at least one cylindrical surface a plurality of slots which extend substantially parallel to the rotational axis of the drum, and sliding a blade into and out of the slots for cutting the film.

14. A method according to claim 9 further comprises sensing a predetermined position of a support member and setting the apparatus for another operating cycle when the predetermined position is sensed.

15. A method of applying a photosensitive film portion to at least one face of a succession of support members each of which has front, side, and rear edges such that the support member face extends beyond the film portion at least at the front edge, the method comprises:
  a. positioning a pair of cylindrical non-rotating sectors so that they have opposing longitudinal edges with walls extending vertically therefrom and cylindrical surfaces extending therefrom,
  b. supplying film having a leading edge to at least one of the cylindrical surfaces such that the leading edge is disposed between the opposing longitudinal edges,
  c. inserting a support member between the opposing longitudinal edges,
  d. positioning the support member such that the front edge thereof extends beyond the film leading edge by a predetermined distance,
  e. attaching the film leading edge to the support member,
  f. causing the support member with the attached film leading edge to travel a predetermined distance equal to a predetermined film portion length which is less than the support member length,
  g. cutting from the film a film portion having the predetermined length whereby the succeeding film leading edge is positioned between the longitudinal edges for lamination of another film portion to another support member,
  h. fixing the film portion to the support member, and
  i. repeating steps c through h for each of the succeeding support members.

16. A method according to claim 15 wherein the step of attaching the film leading edge to the support member includes disposing pad members to slide along the vertical walls respectively, and moving the pad members toward each other to press the film leading edge against the support member.

17. A method according to claim 15 further comprises the step of cutting the film to a predetermined film width less than the respective support member width while it is being supplied to the at least one sector.

18. A method according to claim 15 further comprises the step of supporting the film portions as they leave the at least one sector to prevent the formation of creases and curling as the film portions are disposed on the respective support members by operating a suction box downstream of the at least one sector.

19. A method according to claim 15 further comprises providing perforations in the at least one sector and applying a vacuum internally of the at least one sector to hold the film on the cylindrical surface of the at least one sector.

20. A method according to claim 15 wherein the step of cutting the film includes cutting the film in the zone between the sectors.

* * * * *